Figure 1:
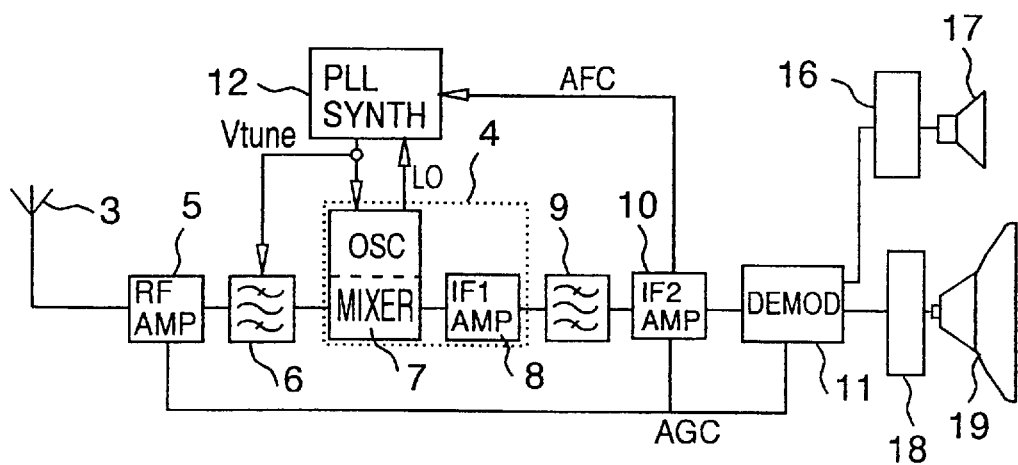

United States Patent [19]
Chevallier et al.

[11] Patent Number: 5,887,246
[45] Date of Patent: Mar. 23, 1999

[54] AMPLIFIER CIRCUIT FOR AN INTERMEDIATE-FREQUENCY SIGNAL OF A RADIO RECEIVER

[75] Inventors: Gilles Chevallier, Langrune sur mer; Olivier Crand, Caen, both of France

[73] Assignee: U.S. Philips Corporation, New York, N.Y.

[21] Appl. No.: 984,828

[22] Filed: Dec. 4, 1997

[30] Foreign Application Priority Data

Dec. 6, 1996 [FR] France .................................. 96 15050
Jan. 14, 1997 [FR] France .................................. 97 00299

[51] Int. Cl.$^6$ ...................................................... H04B 1/06
[52] U.S. Cl. .................. 455/232.1; 455/260; 455/234.2; 455/180.3; 455/255
[58] Field of Search .................................. 329/306, 307, 329/323, 325, 360; 332/126, 127; 342/102, 103; 455/232.1, 260, 180.2, 180.3, 234.2; 375/344, 345; 330/254, 279, 129, 138, 280

[56] References Cited

U.S. PATENT DOCUMENTS

| | | | |
|---|---|---|---|
| 4,292,598 | 9/1981 | Yasumura | 330/281 |
| 4,360,929 | 11/1982 | Isobe | 455/245.1 |
| 4,691,377 | 9/1987 | Yoshihara et al. | 455/256 |
| 4,812,908 | 3/1989 | Frequin | 348/678 |
| 4,827,511 | 5/1989 | Masuko | 380/15 |
| 4,884,142 | 11/1989 | Hyakutake et al. | 358/174 |
| 5,365,279 | 11/1994 | Harford | 348/678 |
| 5,440,586 | 8/1995 | Den Braber | 375/327 |
| 5,630,215 | 5/1997 | Waldie et al. | 455/192.2 |

FOREIGN PATENT DOCUMENTS

0439435A2  7/1991  European Pat. Off. .
63-313905A  12/1988  Japan .

Primary Examiner—Wellington Chin
Assistant Examiner—Isaak R. Jama
Attorney, Agent, or Firm—Laurie E. Gathman

[57] ABSTRACT

The circuit (7, 8, 9, 10) comprises, in addition to the automatic gain control (AGC), a gain reduction means for controlling the gain of an amplifier (8), intended to avoid the desynchronization of the local oscillator (7) controlled by a phase-locked loop comparator (12). This is controlled by a peak detector of the amplified signal situated at the output of the amplifier (8).

10 Claims, 3 Drawing Sheets

AMPLIFIER CIRCUIT FOR AN INTERMEDIATE-FREQUENCY SIGNAL OF A RADIO RECEIVER

The present invention relates to an integrated circuit comprising, inter alia, an intermediate-frequency amplifier circuit intend to work together with a local oscillator which comprises a frequency synthesizer and a phase-locked loop phase comparator, and work together with other amplifier elements, the whole comprising a general automatic gain control means.

The invention has been devised for television reception, but it also applies to other apparatus comprising a frequency synthesizer with a frequency control loop and a general automatic gain control means.

It is an object of the invention to solve a specific problem with respect to amplifier circuits for radio receivers, which is the following: the synchronization of the frequency of the local oscillator tends to degrade when the intermediate-frequency amplifier becomes saturated. The frequency of the local oscillator is controlled by the phase-locked loop comparator called PLL which compares the zero-crossings of the control signal with those of a reference value. When the intermediate-frequency amplifier becomes saturated, it generates additional parasitic signals, notably because of ground returns which convey harmonics, and the phase comparator PLL counts these additional signals as zero-crossings of the useful signal, which degrades the frequency control.

For solving this problem, at least one stage of the intermediate-frequency amplifier circuit has an automatic gain reduction means of its own when an amplitude peak detection circuit for the intermediate-frequency signal detects that the latter exceeds a given threshold, which gain reduction means works independently of the general gain control means, with its own time constant and amplitude detection.

The invention is thus based on the idea of realizing a local automatic gain control to avoid the desynchronization of the frequency of the local oscillator, which local gain control is independent of the general gain control means (called AGC) of the receiver, which general gain control means in its turn continues to work independently of the gain reduction means of the intermediate-frequency amplifier's own gain reduction means.

It is true that amplifier circuits comprising an autonomous automatic gain control system are known in the domain of operational amplifiers. Such an amplifier is described, for example, in the abstract of Japanese patent 63-313905. However, the problems these amplifiers seek to solve are completely different from those encountered in a radio receiver where a PLL comparator and an oscillator are present. Furthermore, in the case of the invention, one could believe that the radio receiver's own automatic gain reduction means which is added to the general AGC disturbs the operation of the latter, or, for example, creates an instability; This is not the case, due to the fact that if the automatic gain reduction means is compared with the general AGC, the detection mode of said gain reduction means is based on a threshold and this threshold corresponds to a relatively high level of the signal, whereas at the same time the control time constant is different.

In a particular embodiment, the amplitude peak detection means comprises means for presenting the error signal with a time constant of the order of several microseconds.

The amplitude peak detection circuit is advantageously a current generator which generates a current used for creating the error signal as a function of the difference between the peak value of the intermediate-frequency signal and a reference value.

In a particular embodiment, the amplitude peak detection circuit comprises a pair of transistors called differential pair, of which the base of the first transistor of the differential pair receives an intermediate-frequency signal from the output of the amplifier, the base of the second transistor of the differential pair is connected to a reference voltage, and the collector of one of the transistors of the differential pair is connected to a voltage source via a capacitor connected in parallel to the series arrangement of a resistor and the base-emitter junction of a transistor which has opposite polarity to that of the transistors of the differential pair and whose collector forms a current output which produces a current used for the creation of the error signal.

The amplifier circuit advantageously comprises at least a bridge divider at the input of the amplifier, comprising in the intermediate-frequency signal path at least a semiconductor element which has a variable impedance as a function of a quiescent current passing through it, which current is controlled by the error signal, whereas the other element of the bridge divider is formed by the internal impedance of the input of the amplifier.

Thus, the dynamic impedance of the elements of the bridge divider may easily be controlled and a time constant is created.

Preferably, the semiconductor element is the base-emitter junction of a transistor arranged as an emitter-follower.

Thus, a high impedance is presented at the input of the arrangement.

The circuit may further comprise at least a diode, placed in the current path used for the creation of the error signal, for creating a voltage which is applied to the base of the first transistor of a transistor pair called differential pair, whereas the collector of the second transistor of this pair forms the source of said quiescent current which passes through a variable impedance semiconductor element.

Advantageously, said gain reduction means provides a time constant that is different depending on whether the gain is increased or diminished.

The effect of this is that the gain control is activated rapidly and deactivated more slowly.

For generating one of the time constants, the amplifier circuit comprises a transistor having its emitter connected to a collector load resistor and having a capacitor between its collector and its base, which base is controlled by the error signal and, for generating the other time constant, a transistor arranged as an emitter-follower, whose emitter is connected to ground by a resistor, whose base is controlled by the error signal, whose main current path is passed through by the error current, and whose base is connected to said load resistor via a capacitor, and a transistor whose emitter is connected to the base of the transistor arranged as an emitter-follower, whose base is connected to the collector of this same transistor and whose collector is connected to a supply voltage.

Thus, the circuit makes use of capacitors having a reduced value, so that they are integrable.

These and other aspects of the invention will be apparent from and elucidated with reference to the embodiments described hereinafter.

Figure 2:
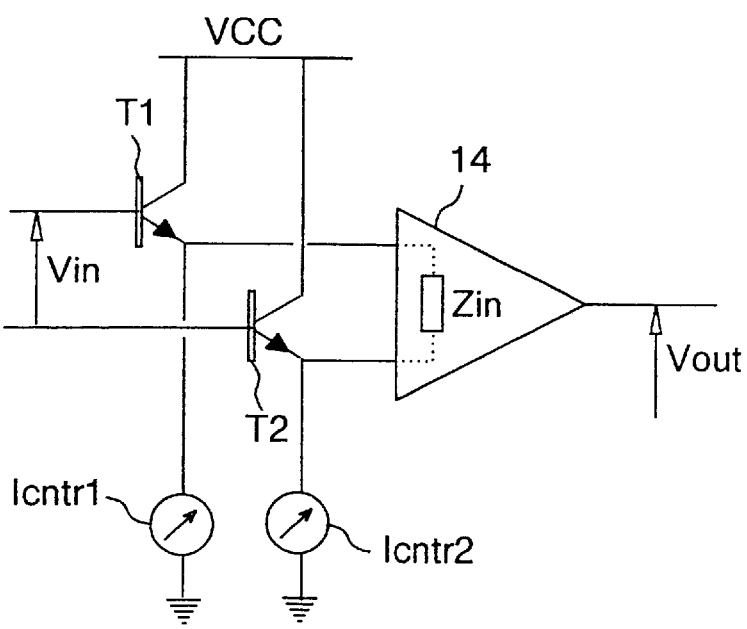
Figure 3:
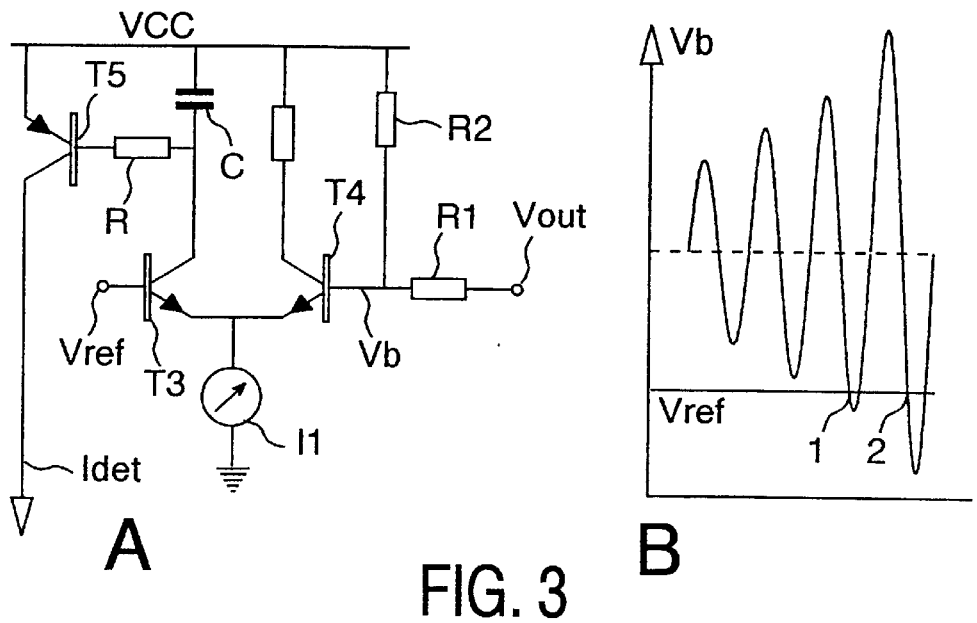
Figure 4:
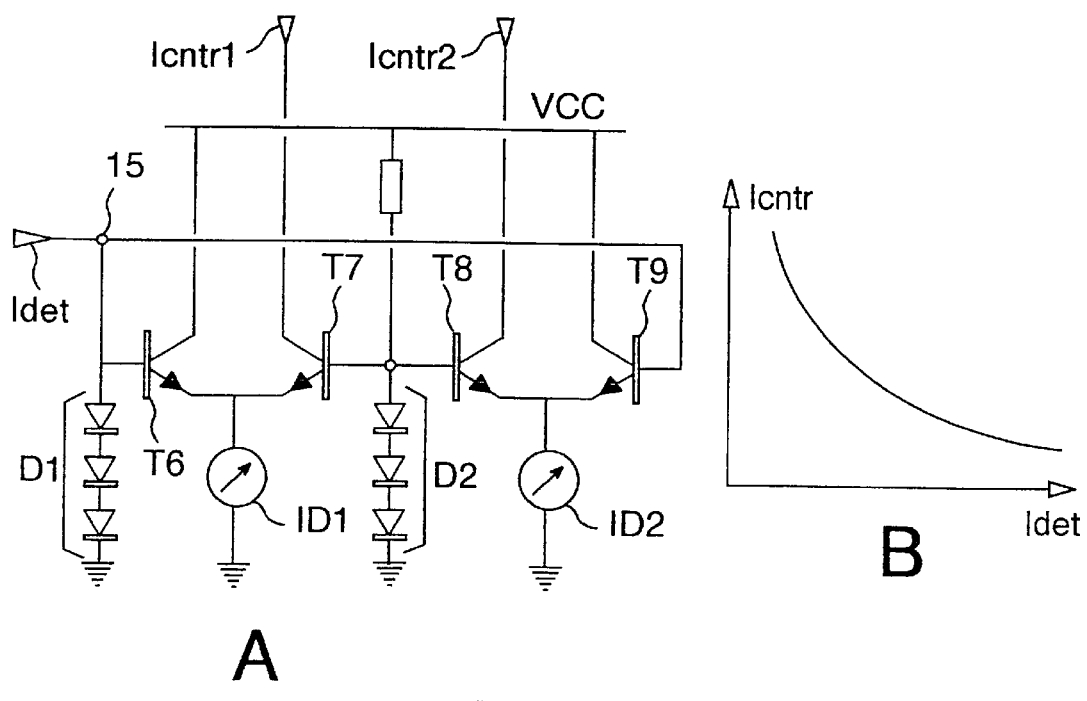
Figure 5:
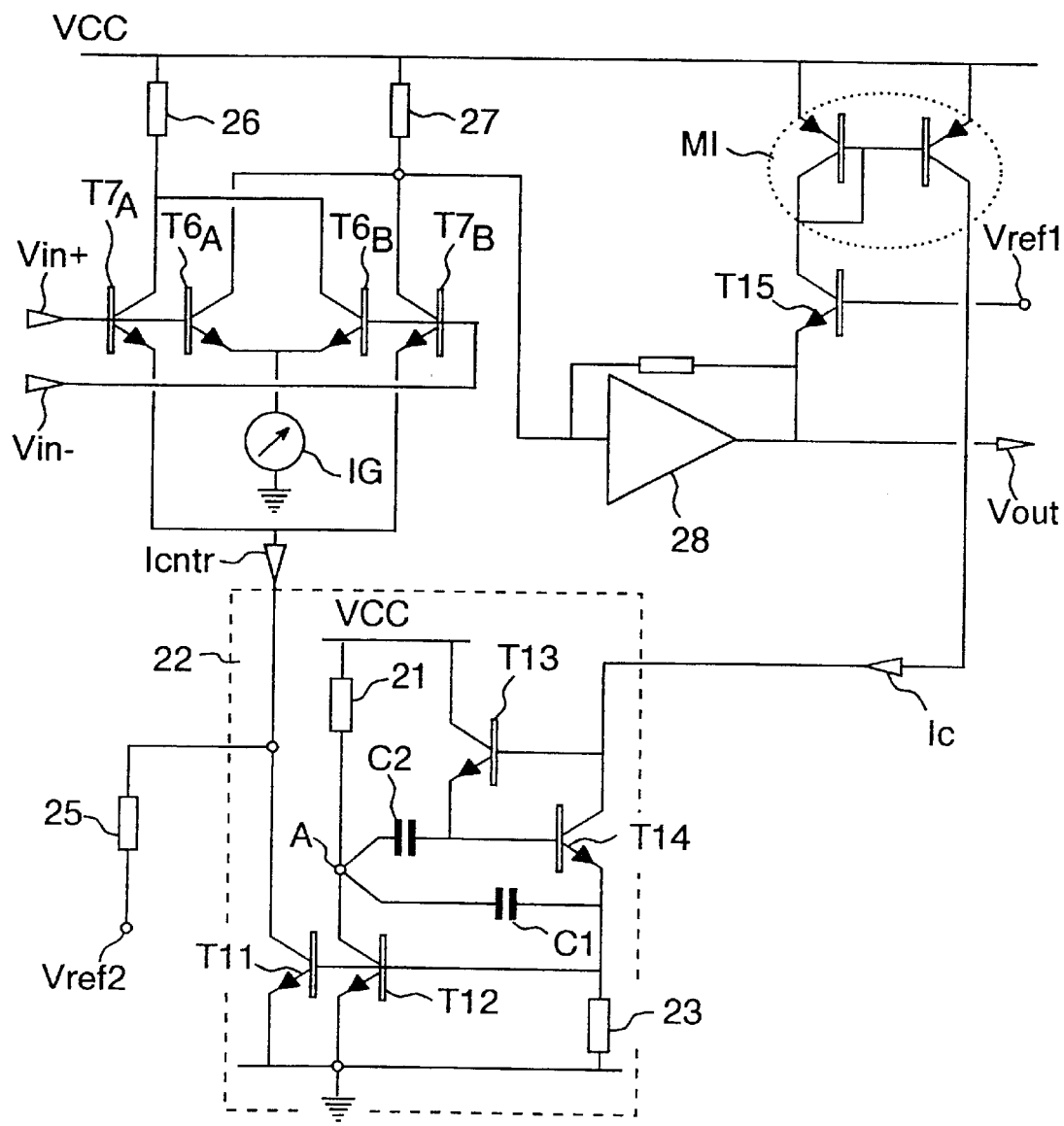

In the drawings:

FIG. 1 diagrammatically shows a radio receiver,

FIG. 2 is a diagram of a part of an intermediate-frequency amplifier circuit,

FIG. 3 represents in A a diagram of an amplitude peak detection circuit and in B a waveform illustrating the operation, FIG. 4 represents in A a diagram of a current source with three diodes in the current path for creating a logarithmic voltage, and in B a curve illustrating the operation, and FIG. 5 is a diagram of a part of a variant of an intermediate-frequency amplifier circuit, with a circuit having two time constants for the gain control.

The television receiver represented by FIG. 1 comprises, starting from an antenna 3, a radio-frequency amplifier 5, a controllable frequency low-pass filter 6, a frequency mixer 7 with a local oscillator, a first intermediate-frequency amplifier 8, a band-pass filter 9, a second intermediate-frequency amplifier 10, a demodulator 11, a video processing circuit 18, a cathode ray tube 19, an audio processing circuit 16, a loudspeaker 17.

The local oscillator is controlled by a frequency synthesizer 12 called PLL which comprises a phase-locked loop and slaves, by means of a control voltage Vtune, the frequency of the local oscillator in known fashion. The demodulator 11 further produces a AGC voltage which represents the amplitude of the amplified signal it receives from the amplifier 10, which allows of the automatic gain control of the amplifiers 10 and 5. Various elements of this assembly may be realized in the same integrated circuit, for example, the elements situated in frame 4.

The circuit represented in FIG. 2, which is a part of the amplifier 8 of FIG. 1, comprises an actual amplifier 14 known per se and which need not be described any further. The circuit is symmetrical with two balanced inputs which receive a signal Vin, and an output which produces a signal Vout. Its input impedance is equal to Zin.

The base-emitter junction of a transistor T1 or T2, arranged as an emitter-follower and charged by a current source Icntr1 or Icntr2 respectively, is put in the signal path of each of the inputs. A bridge divider is formed, on the one hand, by the dynamic impedance of each of these base-emitter junctions and, on the other hand, by the internal impedance of the input Zin of the amplifier. Depending on the value of the average current produced by the source Icntr1 or Icntr2, the dynamic impedance of the base-emitter junction of the transistor varies: if the current of the source Icntr1 or Icntr2 increases, the dynamic impedance will diminish and the gain of the amplifier will augment.

A part of a circuit that produces an error current is represented by FIG. 3A. This circuit has a terminal which receives a signal Vout coming from the amplifier. The circuit comprises a transistor pair called differential pair, formed by two NPN-type transistors T3 and T4 whose emitters are fed together by a current source I1. The base of the first transistor T4 receives a signal which represents the output signal of the amplifier from the node of the resistors R1 and R2. The base of the second transistor T3 is connected to a reference voltage Vref and its collector is connected to a voltage source VCC via a capacitor C, in parallel with the series combination of a resistor R and the base-emitter junction of a PNP transistor T5 having opposite polarity to that of the (NPN) transistors of the differential pair. The collector of the transistor T5 produces a current "Idet" used for creating the error signal. The capacitor C produces a time constant.

FIG. 3B illustrates a waveform applied to the base of the transistor T4 whose amplitude is increasing. At the beginning, the signal has a value which is always above that of the reference voltage Vref, the transistor T4 is conductive, the transistor T3 is cut off. At point 1, the trough of the signal falls below the voltage Vref which cuts off the transistor T4 and thus causes transistor T3 to be conductive inducing a current Idet. At point 2 this happens again, for example, because the correction provided by the current Idet is still insufficient. Due to the time constant produced by the RC assembly, the current Idet does not exactly follow the pulses 1 and 2, but evolves while integrating the pulses 1 and 2. The time constant is chosen to be about 3 to 5 microseconds in the case of an intermediate frequency of about forty megahertz.

The circuit of FIG. 4A is used for generating the currents Icntr1 and Icntr2 for the dynamic impedance control of the transistors of FIG. 2, based on the current Idet of the amplitude peak detector of FIG. 3A; this current is led to an input terminal 15 connected to ground via three diodes D1 connected in series, so as to create a logarithmic voltage based on the current Idet. The input 15 is connected to the base of a first transistor T6 of a transistor pair called differential pair whose emitters are fed in common by a current source ID1. The base of the second transistor T7 of the pair is connected to ground via three diodes D2 whose current is supplied by VCC via a resistor so as to balance the quiescent bias current, for the two transistors T6 and T7. The collector of the second transistor T7 of this pair supplies the current Icntr1. The value of the current ID1 determines the quiescent current Icntr1 of the transistor T1. Two other transistors T8 and T9, connected to the same bias source D1 and D2, produce the current Icntr2 in similar fashion. The curve of FIG. 4B shows the effect produced by the diodes: the produced current Icntr1 (or Icntr2) diminishes when Idet augments, first rapidly, then more and more slowly; the differential pair is driven logarithmically.

The circuit represented by FIG. 5 forms a variant of an embodiment of the amplifier 8 of FIG. 1. It comprises an intermediate-frequency amplifier 28 known per se whose output forms the output Vout of the circuit. For permitting the gain of the assembly to be controlled, a variable gain input stage formed by transistors $T6_a$ to $T7_B$ is placed upstream of the amplifier 28. This stage comprises two differential pairs $T6_A/T6_B$ and $T7_A/T7_B$. The emitters of the pair $T6_A/T6_B$ receive their current via a fixed current generator IG and those of the pair $T7_A/T7_B$ are connected to a control module 22 which draws a current Icntr. The signal to be amplified is symmetric, that is to say, formed by two components Vin+ and Vin−. The signal Vin+ is supplied to the base of the transistor $T6_A$ and to that of the transistor $T7_A$, and the signal Vin− is supplied to the base of the transistor $T6_B$ and to that of the transistor $T7_B$. The collectors of the transistors $T6_B$ and $T7_A$ are together connected to a power supply VCC via a resistor 26 and those of the transistors $T6_A$ and $T7_B$ are together connected to the input of the amplifier 28 and via a resistor 27 to the power supply VCC. It will be obvious that when the current Icntr taken by the module 22 varies, the gain of the arrangement $T7_A-T7_B$ is changed, as is the magnitude of the signal on the input of the amplifier 28. The output Vout is connected to the emitter of a transistor T15 whose base is connected to a reference voltage Vref1. When the peaks at the bottom of the signal Vout, less the base-emitter voltage of the transistor T15, fall below the value Vref1, the transistor T15 becomes conductive and its collector current, "returned" by a current mirror M1, supplies a current Ic to the module 22. This module 22 comprises a transistor T11 whose collector, connected to a reference voltage source Vref2 via a resistor 25, produces the control current Icntr, and whose base is connected to that of a transistor T12. The emitters of the transistors T11 and T12 are connected to ground and the collector of the transistor T12, called "node A" is connected to the power supply VCC via a load resistor 21. A transistor T13 has its collector connected to the power supply VCC and its emitter connected, on the one hand, to the base of a transistor T14 and, on the other hand, to the node A via a capacitor C2. The collector of the transistor T14 and the base of the transistor T13 are together connected to the current lead connection Ic and the emitter of the transistor T14 is connected to ground via a resistor 23, and to the node A via a capacitor C1. The arrangement benefits from the known "Miller" effect: the current Ic, having passed through T14, is practically divided between the resistor 23 and the capacitor C1, while the base current of T12 is supposed to be negligible, and when the voltage rises on the base of T12, while it falls at A, everything happens as if the value of the capacitor C1 were larger, which it is not. It is thus possible to utilize a low-value, thus integrable, capacitor C1. The capacitor C2 is charged very rapidly through the main current path of T13 and practically has no action when the current of T12 is established. When a current Ic has just been established, a current $\beta \times Ic/2$, where $\beta$ is the current gain, is thus progressively established in T11 and T12 with a time constant $\tau = R \times C1$. When Ic disappears, the collector current of T11 and T12 disappears, but in that case with a time constant $\tau = R \times (C1+C2)$.

We claim:

1. An integrated circuit comprising, an intermediate-frequency amplifier circuit intended to work together with a local oscillator which comprises a frequency synthesizer and a phase-locked loop phase comparator, and work together with other amplifier elements, the whole comprising a general automatic gain control means, characterized in that, to avoid a desynchronization of the local oscillator frequency, at least one stage of the intermediate-frequency amplifier circuit has an automatic gain reduction means of its own when an amplitude peak detection circuit for the intermediate-frequency signal detects that the latter exceeds a given threshold, which gain reduction means works independently of the general gain control means, with its own time constant and amplitude detection.

2. The integrated circuit as claimed in claim 1, characterized in that the amplitude peak detection circuit includes means for presenting the error signal with a time constant of the order of several microseconds.

3. The integrated circuit as claimed in claim 1, characterized in that the amplitude peak detection circuit is a current generator which generates a current used for creating the error signal as a function of the difference between the peak value of the intermediate-frequency signal and a reference value.

4. The integrated circuit as claimed in claim 3, characterized in that the amplitude peak detection circuit comprises a pair of transistors called differential pair, of which the base of the first transistor of the differential pair receives an intermediate-frequency signal from the output of the amplifier, the base of the second transistor of the differential pair is connected to a reference voltage, and the collector of one of the transistors of the differential pair is connected to a voltage source via a capacitor connected in parallel to the series arrangement of a resistor and the base-emitter junction of a transistor which has opposite polarity to that of the transistors of the differential pair and whose collector forms a current output which produces a current used for the creation of the error signal.

5. The integrated circuit as claimed in claim 1, characterized in that the integrated circuit advantageously comprises at least a bridge divider at the input of the amplifier, comprising in the intermediate-frequency signal path at least a semiconductor element which has a variable impedance as a function of a quiescent current passing through it, which current is controlled by the error signal, whereas the other element of the bridge divider is formed by the internal impedance of the input of the amplifier.

6. The integrated circuit as claimed in claim 5, characterized in that the semiconductor element is the base-emitter junction of a transistor arranged as an emitter-follower.

7. The integrated circuit as claimed in claim 5, characterized in that the circuit further comprises at least a diode, placed in the current path used for the creation of the error signal, for creating a voltage which is applied to the base of the first transistor of a transistor pair called differential pair, whereas the collector of the second transistor of this pair forms the source of said quiescent current which passes through a variable impedance semiconductor element.

8. The integrated circuit as claimed in claim 1, characterized in that said gain reduction means provides a time constant that is different depending on whether the gain is increased or diminished.

9. The integrated circuit as claimed in claim 8, characterized in that, for generating one of the time constants, the integrated circuit comprises a transistor (T12) having its emitter connected to a collector load resistor and having a capacitor (C1) between its collector and its base, which base is controlled by the error signal.

10. The integrated circuit as claimed in claim 9, characterized in that for generating the other time constant, it comprises a transistor (T14) arranged as an emitter-follower, whose emitter is connected to ground by a resistor, whose base is controlled by an error signal, whose main current path is passed through by the error current, and whose base is connected to said load resistor by a capacitor (C2), and a transistor (T13) whose emitter is connected to the base of the transistor arranged as an emitter-follower, whose base is connected to the collector of this same transistor and whose collector is connected to a supply voltage.

* * * * *